(12) United States Patent
Park et al.

(10) Patent No.: US 6,412,286 B1
(45) Date of Patent: Jul. 2, 2002

(54) STORAGE BOX USING A THERMOELEMENT AND A COOLING METHOD FOR A STORAGE BOX

(75) Inventors: Rae-Eun Park, Suwon; Jun-Hyoun Kwon; Chang-Nyeun Kim, both of Seoul; Yoon-Young Kim; Jae-Seung Lee, both of Suwon, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/903,516

(22) Filed: Jul. 13, 2001

(30) Foreign Application Priority Data

Apr. 24, 2001 (KR) .............................. 01-22074

(51) Int. Cl.⁷ .............................. F25B 21/02
(52) U.S. Cl. .............................. 62/3.6; 62/441; 62/457.1
(58) Field of Search .............................. 62/3.2, 3.3, 3.6, 62/3.62, 249, 441, 457.1, 457.5

(56) References Cited

U.S. PATENT DOCUMENTS

| | | | | |
|---|---|---|---|---|
| 3,177,671 A | * | 4/1965 | Stambaugh | 62/3 |
| 3,209,547 A | * | 10/1965 | Elfving | 62/3 |
| 4,089,184 A | * | 5/1978 | Beitner | 62/3 |
| 5,605,047 A | * | 2/1997 | Park et al. | 62/3.6 |
| 6,038,865 A | * | 3/2000 | Watanabe et al. | 62/3.6 |

FOREIGN PATENT DOCUMENTS

JP hei10-9741 1/1998

* cited by examiner

Primary Examiner—Denise L. Esquivel
Assistant Examiner—Melvin Jones
(74) Attorney, Agent, or Firm—Robert E. Bushnell, Esq.

(57) ABSTRACT

A storage box with a thermoelement is disclosed. This storage box is operable in a frozen-storage mode operation, in addition to a cool-storage mode and a hot-storage mode. During a cool-storage mode operation of the storage box, the main compartment (14) is primarily cooled by a main thermoelement (20) to be kept at a low temperature. The temperature difference between the areas around the two junctions (61, 62) of the sub-thermoelement (60) of a sub-storage unit (50) installed within the main compartment (14) is sufficiently smaller than that between the areas around the two junctions of the main thermoelement irrespective of a consideration of an addition of heat produced from heat exchanging units provided at the two junctions of each thermoelement. The sub-thermoelement (60) is thus significantly improved in its cooling capacity. The temperature of the sub-compartment (52) of the sub-storage unit (50) is thus reduced lower than 0° C., and so the sub-compartment is kept in a frozen-storage mode. The sub-storage unit (50) is removable from the main compartment (14), thus allowing a user to use it independently from the storage box in, for example, a car.

15 Claims, 5 Drawing Sheets

STORAGE BOX USING A THERMOELEMENT AND A COOLING METHOD FOR A STORAGE BOX

CLAIM OF PRIORITY

This application makes reference to, incorporates the same herein, and claims all benefits accruing under 35 U.S.C. §119 from an application for A STORAGE CHAMBER WITH PELTIER ELEMENT earlier filed in the Korean Industrial Property Office and there duly assigned Ser. No. 22074/2001 by that Office.

BACKGROUND OF THE INVENTION

1. Field of the Invention

The present invention relates to a storage box using a thermoelement and, more particularly, to a storage box using a thermoelement, designed to be selectively operated in a cool-storage mode or a hot-storage mode by changing the polarity of the electric current applied to the thermoelement as desired.

2. Description of the Prior Art

As well known to those skilled in the art, conventional refrigerators are designed to feed cool air from the evaporator of its refrigeration cycle into storage compartments, that is, a freezer compartment and a refrigerator compartment defined inside a cabinet, thus keeping food cool to maintain freshness of the food for a desired lengthy period of time. However, the conventional refrigerators are limited in their use since they only perform a cool-storage function within the freezer and refrigerator compartments. In addition, the conventional refrigerators must have a plurality of elements, such as a condenser, an evaporator and a compressor, for fabricating the refrigeration cycle.

In an effort to overcome such problems of the conventional refrigerators, a storage box designed to be selectively operated in a cool-storage mode or a hot-storage mode using a thermoelement has been proposed and used. Such a conventional storage box includes a cabinet defining a storage compartment, a door hinged to the cabinet for closing or opening the storage compartment, and a thermoelement mounted to a predetermined portion of the cabinet.

The thermoelement is a thermal converter using the Peltier effect. That is, the thermoelement is composed of two dissimilar metal plates such that the two plates are jointed together at two junctions, and the electrons of the element absorb heat energy from a heat source at one junction to perform a cooling action, and evolve heat energy at the other junction to a heat sink to perform a heat dissipating action when a DC voltage is applied to the element.

When the thermoelement is arranged such that a junction thereof is positioned within a target compartment of a storage box, it is possible to cool or heat the target compartment as desired by controlling the polarity of the DC voltage applied to the element. That is, when a DC voltage is applied to the thermoelement such that heat is dissipated from the junction of the element into the target compartment to increase the temperature of the compartment, the storage box is operated as a hot-storage box.

However, when the polarity of the DC voltage applied to the thermoelement is changed, the junction absorbs heat from air inside the target compartment to cool the interior of the compartment. In such a case, the storage box is used as a cool-storage box. Therefore, the storage box having such a thermoelement can be operated in a hot-storage mode or a cool-storage mode by controlling the polarity of the DC voltage applied to the element.

However, the conventional storage box having such a thermoelement is undesirably limited in its use to the cool-storage mode and the hot-storage mode, but cannot perform a frozen-storage mode. It is thus impossible for such conventional storage boxes to meet a variety of requirements of consumers.

When it is desired to keep the temperature of the target compartment of a storage box at about −15° C. in the case of an environmental temperature of about 30° C., the practical temperature difference between the two junctions of the thermoelement is calculated to about 62° C. since additional heat generated from operation of heat exchanging units provided at the two junctions must be added to the arithmetic temperature difference between the target compartment and the environmental temperature. The cooling operational effect of the thermoelement is intrinsically reduced in inverse proportion to the temperature difference between the two junctions of the thermoelement. Therefore, it is almost impossible for the conventional primary cooling systems, using one thermoelement, to keep the temperature of a target storage compartment at about −15° C. in the case of an environmental temperature of about 30° C.

SUMMARY OF THE INVENTION

Accordingly, the present invention has been made keeping in mind the above problems occurring in the prior art, and an object of the present invention is to provide a storage box using a thermoelement, of which the storage compartment has a small-sized sub-storage unit having its own thermoelement, and so a frozen-storage mode operation is performed by the sub-storage unit during a cool-storage mode operation of the storage compartment.

Another object of the present invention is to provide a storage box using a thermoelement, of which the small-sized sub-storage unit is designed to be removable from the storage compartment of the storage box, and which thus allows a user to use the sub-storage unit independently from the storage box in, for example, a car.

In order to accomplish the above object, the present invention provides a storage box using a thermoelement, including: a cabinet defining a storage compartment therein; a main thermoelement installed in a wall of the cabinet so as to allow the storage compartment to act as a cool-storage compartment or a hot-storage compartment; and a sub-storage unit installed in the storage compartment, and having a sub-thermoelement so as to be operated in a frozen-storage mode through a multi-stage cooling operation during a cool-storage mode operation of the storage compartment.

The sub-storage unit includes: a body defining a sub-storage compartment therein and having the sub-thermoelement in its wall; a door mounted to the body so as to open or close the sub-storage compartment; and a heat dissipating unit provided at the heat dissipating junction of the sub-thermoelement.

A heat exchanging panel is arranged in the storage compartment of the cabinet to come into contact with the heat absorbing junction of the sub-thermoelement, while a fan is arranged in the body so as to allow the heat dissipating unit to evolve heat to air of the storage compartment of the cabinet.

A means for detachably installing the body of the sub-storage unit within the storage compartment of the cabinet is provided at the junction of the body and the inner wall of the storage compartment of the cabinet. The detachably installing means includes: a rail horizontally provided on the inner surface of a storage compartment's sidewall of the cabinet;

and a channel provided on the outer surface of the body of the sub-storage unit for engaging with the rail.

A projection is provided on the channel, while a notch is formed on the rail to seat the projection therein when the sub-storage unit is installed in the storage compartment of the cabinet.

In the storage box, a chamber may be provided in the storage compartment of the cabinet for seating the sub-storage unit therein.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Reference now should be made to the drawings, in which the same reference numerals are used throughout the different drawings to designate the same or similar components.

Figure 1:
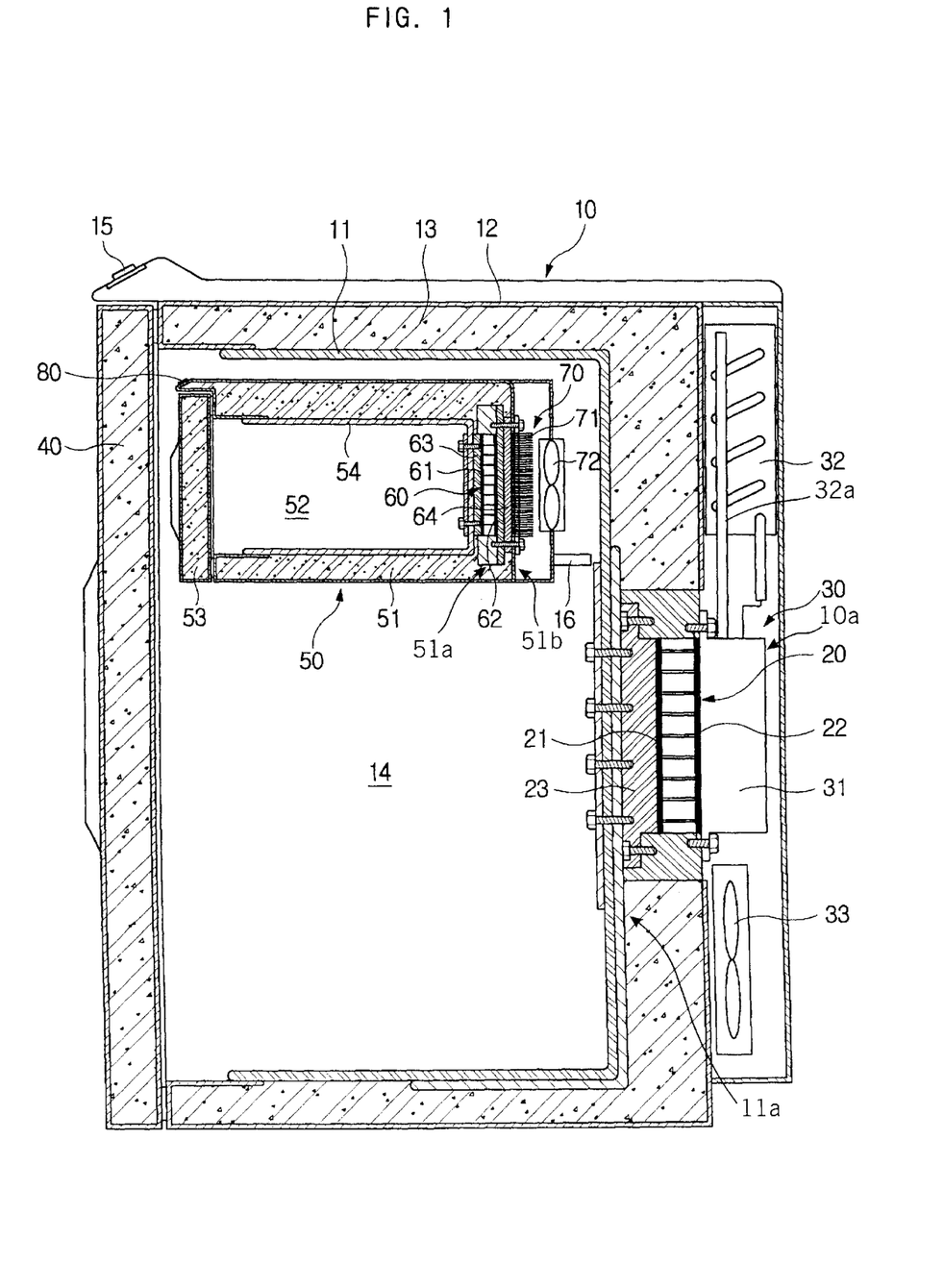
FIG. 1 is a side sectional view showing the construction of a storage box using a thermoelement in accordance with the present invention.

FIG. 1 is a side sectional view showing the construction of a storage box using a thermoelement in accordance with the present invention. As shown in the drawing, the storage box of this invention includes a box-shaped cabinet 10 defining a main storage compartment 14 for storing food therein, and a door 40 hinged to the cabinet 10 for closing or opening the main compartment 14. The storage box also has a small-sized sub-storage unit 50. This sub-storage unit 50 is installed in the main compartment 14, and is operated in a frozen-storage mode through a multi-stage cooling operation during a cool-storage mode operation of the main compartment 14.

The cabinet 14 consists of an inner casing 11 defining the main compartment 14 that is open at its front. A main thermoelement 20 is installed in the rear wall of the inner casing 11, and performs a heat absorbing action and a heat dissipating action at its two junctions. The inner casing 11 is housed by an outer casing 12, with an insulation wall 13 closely interposed between the inner and outer casings 11 and 12 to thermally insulate the interior of the main compartment 14 from the outside of the outer casing 12.

The inner and outer casings 11 and 12 are assembled together such that a gap is defined between them and is filled with urethane foam to form the insulation wall 13. In the present invention, it is preferred to produce the inner casing 11 using aluminum suitable for increasing the thermal conductivity of the main thermoelement 20. A control panel 15, having a variety of control buttons and stored with a temperature control program, is provided at a desired top portion of the cabinet 10.

The main thermoelement 20 is a thermal converter using the Peltier effect. When an electric current is applied to a semiconductor (or a conductor) of the main thermoelement 20 in a normal direction, the first junction 21 of the thermoelement 20 is cooled, while the second junction 22 is heated. This main thermoelement 20 is installed in the rear wall 11a of the inner casing 11 such that the first junction 21 is brought into contact with the inner casing 11 through a heat transfer block 23, and easily controls the temperature of the main compartment 14 in response to a change in the flowing direction of the applied electric current. In such a case, the second junction 22 is positioned such that it is exposed to the atmosphere. The main thermoelement 20 is fabricated with two types of dissimilar thermoelectric semiconductors: a plurality of n-type and p-type thermoelectric semiconductors alternately arranged along a longitudinal axis of the thermoelement 20 while being joined together into a single body at two junctions. When an electric current is applied to the main thermoelement 20 in a direction, the two junctions of the two types of semiconductors perform a heat absorbing action and a heat dissipating action, respectively. When the flowing direction of the electric current applied to the thermoelement 20 is changed, the heat absorbing action and the heat dissipating action of the two junctions are reversed. The main compartment 14 of the storage box is thus usable as a cool-storage compartment or a hot-storage compartment as desired.

A heat dissipating unit 30, using a thermosiphon, is installed in the rear portion 10a of the cabinet 10 for dissipating heat from the second junction 22 of the thermoelement 20 during a cool-storage mode operation of the storage box. The heat dissipating unit 30 is brought into contact with the second junction 22 of the thermoelement 20. This heat dissipating unit 30 is composed of an evaporator 31 for evaporating a working fluid to make a gas-phase working fluid, a condenser 32 for condensing the gas-phase working fluid fed from the evaporator 31 to make a liquid-phase working fluid, and a cooling fan 33 operated to improve the condensing efficiency of the condenser 32. The condenser 32 is positioned higher than the evaporator 31, and is connected to the evaporator 31 through a working fluid pipe 32a to form a closed circuit. During an operation of the storage box, heat of the second junction 22 of the thermoelement 20 is transferred to the evaporator 31, thus evaporating the working fluid in the evaporator 31 to make a gas-phase working fluid. The gas-phase phase working fluid is fed from the evaporator 31 to the condenser 32, thus being condensed to become a liquid-phase working fluid prior to being returned to the evaporator 31.

The sub-storage unit 50 has a sub-thermoelement 60, which performs a heat absorbing action and a heat dissipating action at its two junctions to allow the sub-storage unit 50 to perform a frozen-storage mode operation during a cool-storage mode operation of the main compartment 14. This sub-storage unit 50 consists of a body 51, which defines a sub-storage compartment 52 for storing food therein, with the sub-thermoelement 60 installed in the rear wall 51a of the body 51. A door 53 is hinged to the open at a front of the body 51 for closing or opening the sub-compartment 52. A heat dissipating unit 70 is installed in the sub-storage unit 50 at a position around the heat dissipating junction of the sub-thermoelement 60 such that the heat dissipating unit 70 is exposed to the outside of the body 51.

The body 51 of the sub-storage unit 50 is a box-shaped body, which defines the sub-compartment 52 therein and is opened at its front. A heat exchanging panel 54 is arranged on the inner surface of the sub-compartment 52 such that the panel 54 is brought into contact with the first junction 61 of the sub-thermoelement 60 through a front heat transfer block 63. The first junction 61 of the thermoelement 60 acts as a heat absorbing junction during a frozen-storage mode operation of the sub-storage unit 50.

The heat dissipating unit 70 is installed in the rear portion 51b of the body 51 such that the unit 70 is brought into contact with the second junction 62 of the sub-thermoelement 60 through a rear heat transfer block 64. This second junction 62 acts as a heat dissipating junction during the frozen-storage mode operation of the sub-storage unit 50. The heat dissipating unit 70 is a kind of heat sink fabricated with a plurality of cooling fins 71. A fan 72 is installed in back of the rear portion 51b of the body 51 for improving the operational efficiency of the heat dissipating unit 70. That is, the fan 72 feeds air from the main compartment 14 to the heat dissipating unit 70, thus allowing the unit 70 to dissipate heat to the air. The air of the main compartment 14 is actively and continuously circulated by the fan 72, and so maintaining a uniform temperature distribution throughout the compartment 14 regardless of the area within the compartment 14.

During an operation of the sub-storage unit 50, the heat dissipating unit 70 dissipates heat into the main compartment 14. However, since the capacity of the main thermoelement 20 is sufficiently higher than that of the sub-thermoelement 60, it is possible to prevent an undesired increase in the temperature of the main compartment 14 irrespective of the heat dissipation from the heat dissipating unit 70 to the main compartment 14. In addition, a uniform temperature distribution is maintained throughout the compartment 14 regardless of the area within the compartment 14 due to the active air circulation within the compartment 14 performed by the fan 72.

Figure 2:
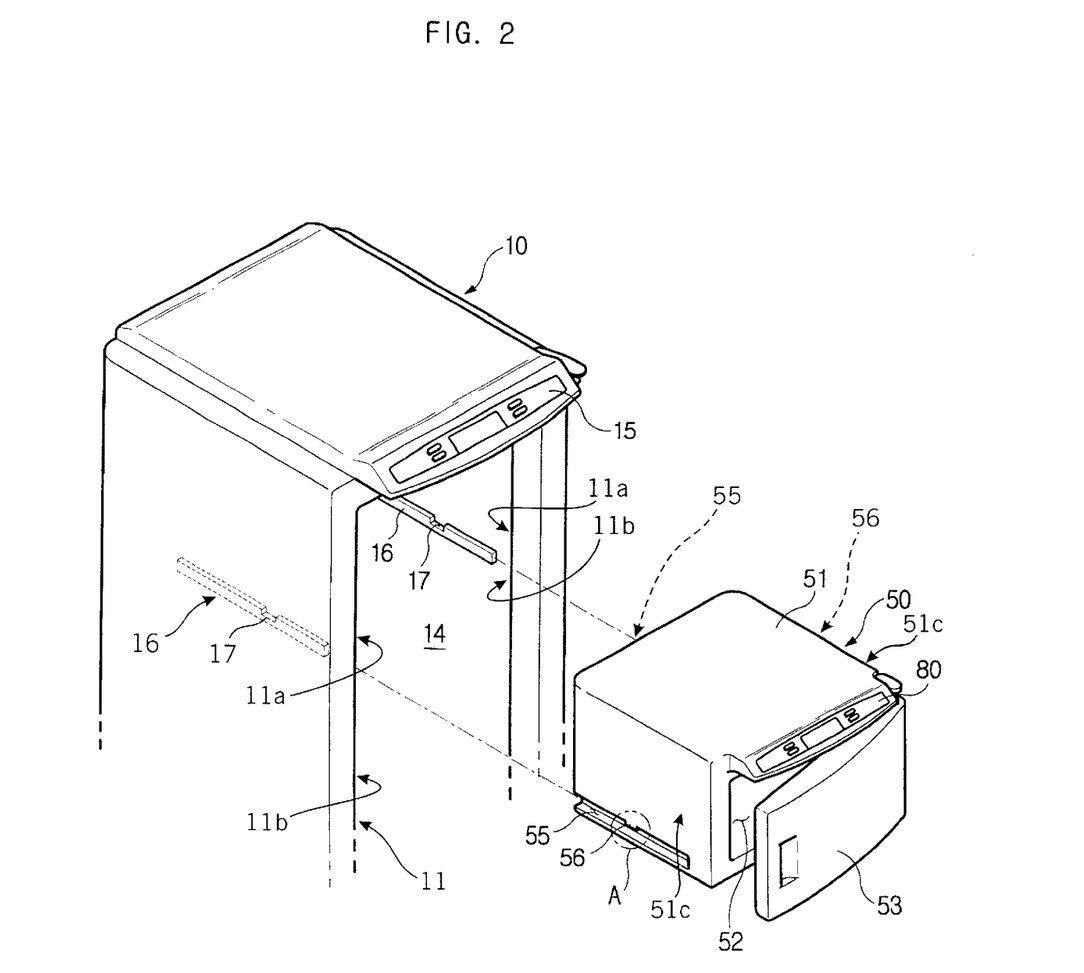
FIG. 2 is a perspective view of the storage box of this invention, showing a structure for allowing a detachable installation of a sub-storage unit within the storage box in accordance with an embodiment of this invention.

In FIGS. 1 and 2, the reference numeral 80 denotes a sub-control panel, which is provided at a desired top portion of the body 51 and has a variety of control buttons, in addition to storing a temperature control program.

Figure 3:
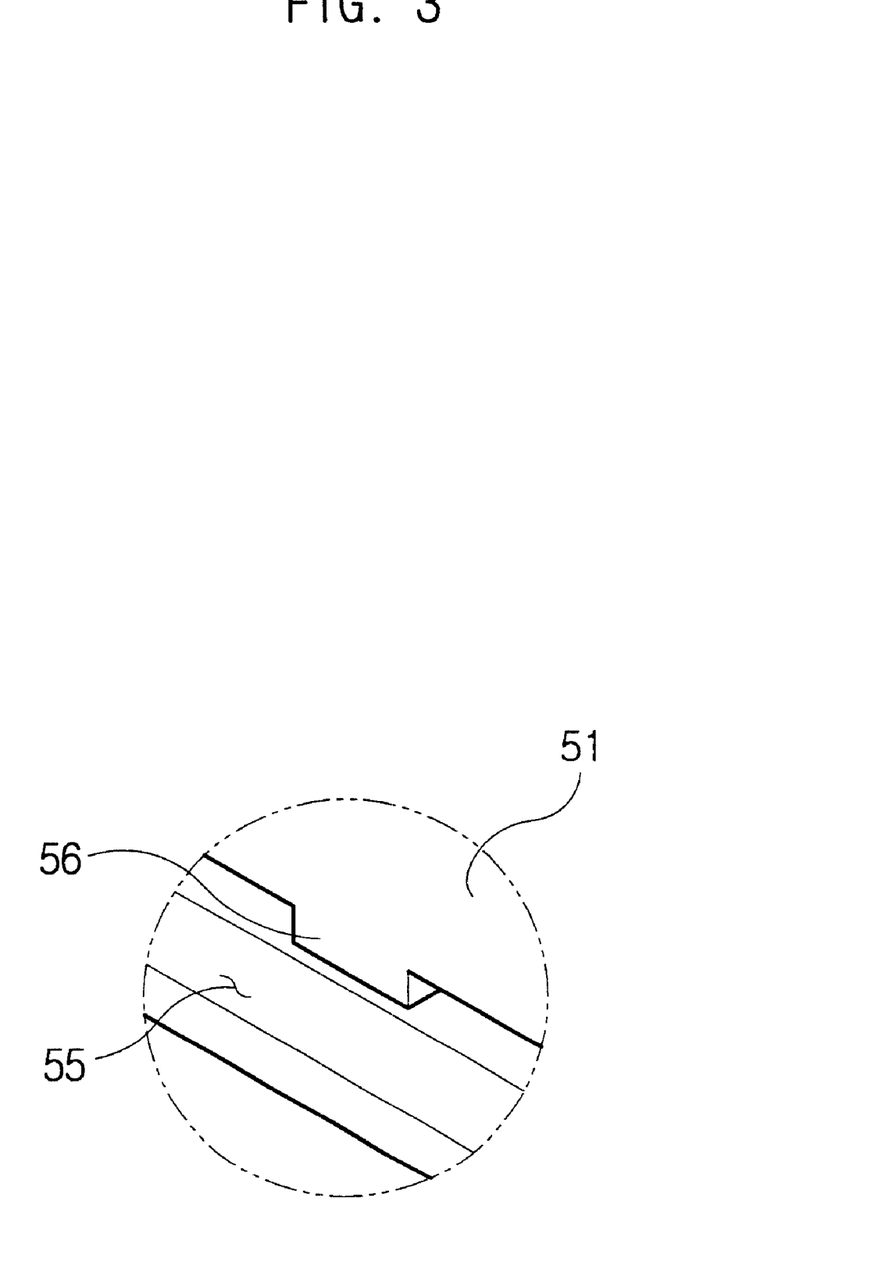
FIG. 3 is a enlarged view of a portion of "A" in FIG. 2.
Figure 4:
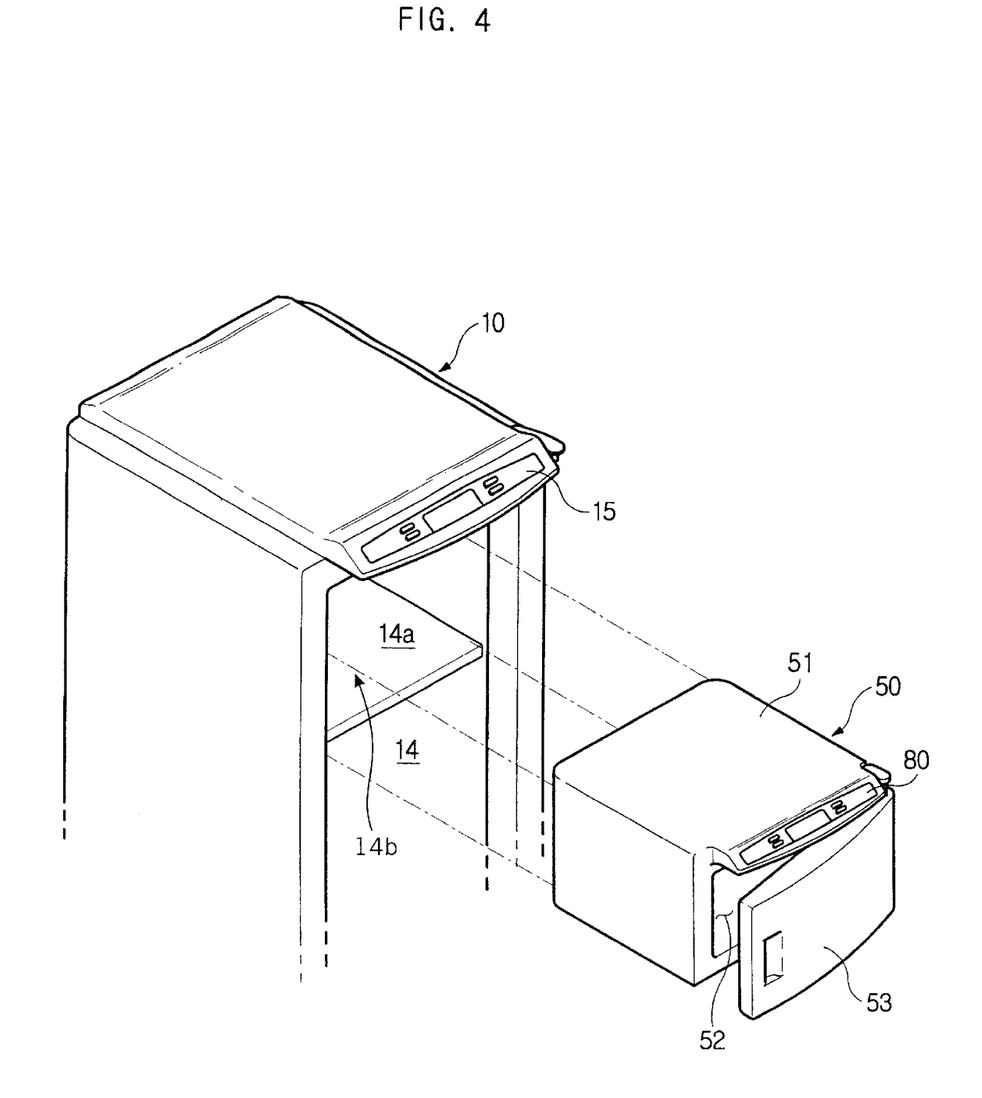
FIG. 4 is a perspective view of a storage box, with a structure for allowing the detachable installation of the sub-storage unit within the storage box in accordance with another embodiment of the present invention.

The small-sized sub-storage unit 50 is designed to be removable from the main compartment 14 of the storage box as shown in FIG. 2 and FIG. 3, and so a user is allowed to use the sub-storage unit 50 independently from the storage box as desired. In order to accomplish the above-mentioned removable installation of the sub-storage unit 50 within the main compartment 14, a pair of two guide rails 16 are horizontally and symmetrically provided on the inner surfaces 11a of opposite sidewalls 11b of the inner casing 11 at a desired upper portion. In order to movably engage with the two guide rails 16, a pair of two guide channels 55 are horizontally and symmetrically formed on the outer surfaces of opposite sidewalls 51c of the body 51 at a desired lower portion. In order to allow the sub-storage unit 50 to be stably installed within the main compartment 14, a locking projection 56 is formed at the middle portion of each of the guide channels 55, while a locking notch 17 is formed at the middle portion of each of the guide rails 16.

In the storage box of the present invention, it is possible to independently operate the sub-storage unit 50 within the main compartment 14 as desired by turning on only the sub-storage unit 50 after the sub-storage unit 50 is installed within the main compartment 14 with the guide rails 16 and guide channels 55 engaging with each other. In such a case, the projections 56 of the channels 55 engage with the notches 17 of the rails 16, thus allowing a stable installation of the sub-storage unit 50 within the main compartment 14.

When it is desired to remove the sub-storage unit 50 from the main compartment 14 so as to use the sub-storage unit 50 independently from the storage box in, for example, a car, the sub-storage unit 50 is pulled from the compartment 14 after slightly raising the sub-storage unit 50 upward from the rails 16. When the sub-storage unit 50 is removed from the main compartment 14, the two rails 16 may be used for supporting a shelf (not shown) for supporting objects.

The operational effect of the above-mentioned storage box of this invention will be described herein below.

First, the storage box, with the sub-storage unit 50 installed inside the main compartment 14, is operated as follows in the case of a cool-storage mode operation of the compartment 14.

After the sub-storage unit 50 is installed within the compartment 14, the storage box is turned on by operating the main control panel 15 to apply DC voltages to both the main thermoelement 20 and the sub-thermoelement 60, thus starting the cool-storage mode operation of the main compartment 14. In such a case, the first junction 21 of the main thermoelement 20 performs a heat absorbing action to keep the temperature of the main compartment 14 at about 3° C., and maintains the compartment 14 in a cool-storage mode. In such a case, the second junction 22 of the main thermoelement 20 performs a heat dissipating action.

During the cool-storage mode operation of the main compartment 14, the temperature difference between the areas around the two junctions 61 and 62 of the sub-thermoelement 60 is relatively smaller than that of the main thermoelement 20. The temperature of the sub-storage unit's compartment 52 is thus reduced lower than that of the main compartment 14 to be kept at a point of lower than 0° C. The compartment 52 of the sub-storage unit 50 is thus kept in a frozen-storage mode.

Figure 5:
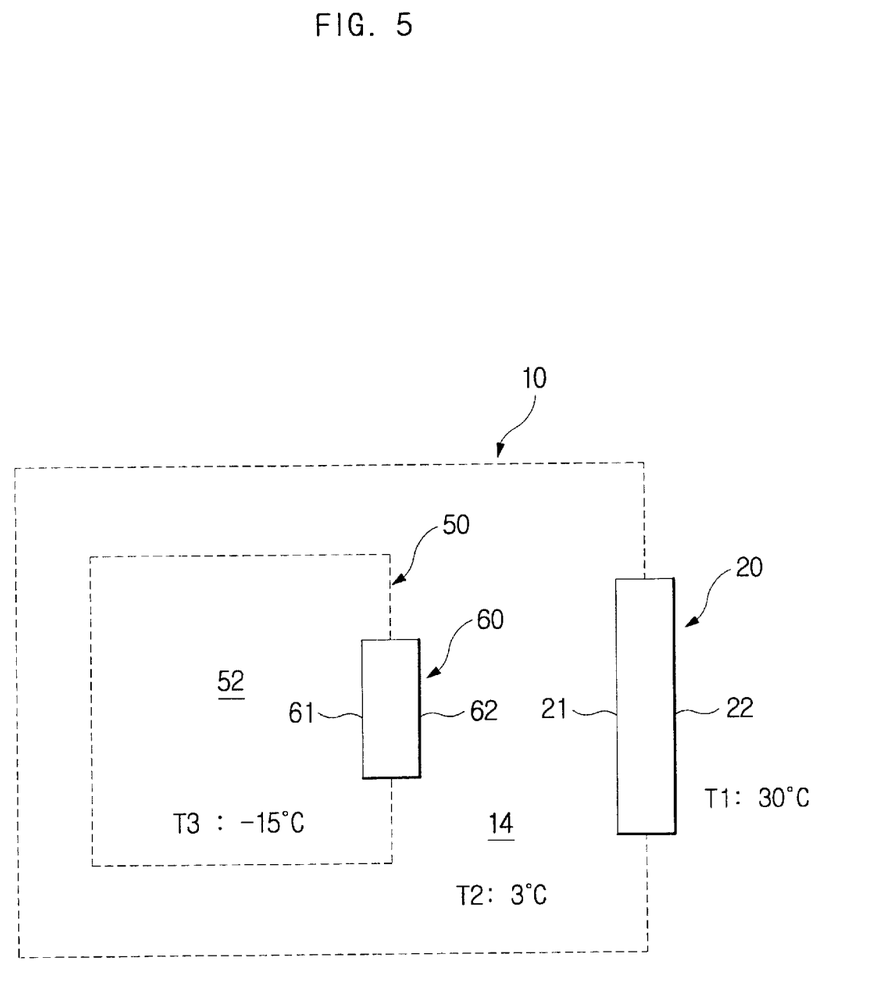
FIG. 5 is a block diagram showing the construction of the storage box according to the present invention.

In a detailed description with reference to FIG. 5, the temperature T2 of the main compartment 14 is kept at about 3° C. due to the operation of the main thermoelement 20 in the case of an environmental temperature T1 outside the cabinet 10 of about 30° C. This means that the temperature of the area around the second junction 62 of the sub-thermoelement 60 acting as a heat dissipating junction is kept at about 3° C. The compartment 52 of the sub-storage unit 50 is thus reduced in its temperature T3 to about −15° C., and is kept in a frozen-storage mode.

This is caused by the fact that the temperature difference between the areas around the two junctions 61 and 62 of the sub-thermoelement 60 is relatively smaller than that of the main thermoelement 20 as described above. That is, the difference $\Delta T1$ between the temperature T1 outside the cabinet 10 and the temperature T2 of the main compartment 14 is arithmetically calculated to 27° C. The difference $\Delta T2$ between the temperature T2 of the main compartment 14 and the temperature T3 of the sub-compartment 52 is arithmetically calculated to 18° C.

However, the practical temperature difference between the two junctions of each of the main thermoelement 20 and sub-thermoelement 60 is calculated to about 43° C. in the case of the main thermoelement 20 and about 30° C. in the case of the sub-thermoelement 60. This is caused by the fact that additional heat generated from the operation of heat exchanging units, such as heat dissipating unit 30 using a thermosiphon and the heat dissipating unit 70 of the heat sink type provided at the two junctions of the corresponding main thermoelement 20 and the sub-thermoelement 60, must be added to each arithmetic temperature difference. Therefore, the temperature difference $\Delta T2$ between the areas around the two junctions 61 and 62 of the sub-thermoelement 60 is sufficiently smaller than the temperature difference ΔT1 between the areas around the two junctions 21 and 22 of the main thermoelement 20. The sub-storage unit 50 performs a frozen-storage mode operation due to the operational function of the main thermoelement 20 and sub-thermoelement 60 during the cool-storage mode operation of the main compartment 14.

In order to accomplish the frozen-storage mode of the sub-storage unit 50, the main compartment 14 is primarily cooled by the main thermoelement 20 prior to secondarily cooling the sub-storage unit's compartment 52 using the sub-thermoelement 60. The temperature of the sub-storage unit's compartment 52 is thus reduced lower than 0° C.

At the second junction 22 of the main thermoelement 20, the heat dissipating unit 30, using a thermosiphon and consisting of the evaporator 31, the condenser 32 and the cooling fan 33, performs a heat dissipating action. At the second junction 62 of the sub-thermoelement 60, the heat dissipating unit 70 performs a heat dissipating action. In addition, the fan 72 of the sub-storage unit 50 actively and continuously circulates air of the main compartment 14, thus improving the operational efficiency of the heat dissipating unit 70 and maintaining a uniform temperature distribution throughout the compartment 14 regardless of the area within the compartment 14.

Second, the sub-storage unit 50 may be removed from the main compartment 14 to be used independently from the storage box as follows.

When it is desired to remove the sub-storage unit 50 from the main compartment 14 to use it independently from the storage box, the sub-storage unit 50 is pulled from the main compartment 14 while slightly raising the sub-storage unit 50 upward from the rails 16 after opening the door 40. In such a case, the projections 56 of the channels 55 are released from the notches 17 of the rails 16, thus allowing the sub-storage unit 50 to be removed from the main compartment 14 under the guide of the rails 16.

When the sub-storage unit 50 is connected to an appropriate power source, such as the cigar lighter provided on the dashboard of a car, the sub-storage unit 50 can be used as a cool-storage unit or a hot-storage unit in accordance with a flowing direction of the DC voltage applied to the sub-storage unit 50.

Of course, the storage box may be used as a cool-storage box or a hot-storage box independently from the sub-storage unit 50 removed from the main compartment 14. That is, when a DC voltage is applied to the storage box such that the first junction 21 of the main thermoelement 20 acts as a heat dissipating junction and the second junction 22 acts as a heat absorbing junction, the main compartment 14 is operated in a hot-storage mode. However, when the flowing direction of the electric current applied to the storage box is changed, the actions of the two junctions 21 and 22 of the main thermoelement 20 are reversed to allow the main compartment 14 to act as a cool-storage compartment.

As described above, the present invention provides a storage box using a thermoelement. During a cool-storage mode operation of the main compartment of the storage box, the main compartment is primarily cooled by a main thermoelement to be kept at a low temperature. Therefore, the temperature difference between the areas around the two junctions of the sub-thermoelement of a sub-storage unit installed within the main compartment is sufficiently smaller than that between the areas around the two junctions of the main thermoelement irrespective of a consideration of an addition of heat produced from heat exchanging units provided at the two junctions of each thermoelement. The sub-thermoelement of the sub-storage unit is thus significantly improved in its cooling capacity. The temperature of the sub-compartment of the sub-storage unit is thus reduced lower than 0° C., and so the sub-compartment is kept in a frozen-storage mode. The sub-storage unit is designed to be removable from the main compartment of the storage box, thus allowing a user to use it independently from the storage box in, for example, a car.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A storage box using a thermoelement, comprising:
   a cabinet including a storage compartment;
   a main thermoelement installed in a wall of the cabinet so as to allow the storage compartment to selectively act as any of a cool-storage compartment and a hot-storage compartment; and
   a sub-storage unit installed in the storage compartment, the sub-storage unit including a sub-thermoelement so as to allow the sub-storage unit to be operated in a frozen-storage mode through a multi-stage cooling operation during a cool-storage mode operation of the storage compartment.

2. The storage box according to claim 1, further comprised of the sub-storage unit comprising:
   a body including a sub-storage compartment and including the sub-thermoelement in a wall of the body;
   a door mounted to the body so as to selectively open and close the sub-storage compartment; and
   a heat dissipating unit provided at a heat dissipating junction of the sub-thermoelement.

3. The storage box according to claim 2, further comprised of a heat exchanging panel being arranged in the body of the sub-storage unit to come into contact with a heat absorbing junction of the sub-thermoelement.

4. The storage box according to claim 2, further comprised of a fan being arranged in the body of the sub-storage unit so as to allow the heat dissipating unit to dissipate heat to air from the storage compartment of the cabinet.

5. The storage box according to claim 2, further comprising means for detachably installing the body of the sub-storage unit within the storage compartment of the cabinet being provided at a junction of the body of the sub-storage unit and an inner wall of the storage compartment of the cabinet.

6. The storage box according to claim 5, further comprised of said means for detachably installing the body of the sub-storage unit comprising:
   a rail horizontally provided on an inner surface of a sidewall of the storage compartment of the cabinet; and
   a channel provided on an outer surface of the body of the sub-storage unit for engaging with the rail.

7. The storage box according to claim 6, further comprised of a projection being provided on the channel, and a notch being formed on the rail to seat the projection in the notch when the sub-storage unit is installed in the storage compartment of the cabinet.

8. The storage box according to claim 2, further comprising a chamber being provided in the storage compartment of the cabinet for receiving the sub-storage unit in the chamber.

9. The storage box according to claim 6, further comprised of said means for detachably installing the body of the sub-storage unit comprising:

a pair of rails, each rail of the pair of rails being respectively provided on an inner surface of a sidewall of opposing sidewalls of the storage compartment of the cabinet; and a pair of channels, each channel being respectively provided on the outer surface of the body of the sub-storage unit for respectively engaging with a corresponding rail of the pair of rails.

10. The storage box according to claim 9, further comprised of a projection being provided on each channel of the pair of channels, and a notch being formed on each rail of the pair of rails to respectively seat a corresponding projection in a corresponding notch when the sub-storage unit is installed in the storage compartment of the cabinet.

11. The storage box according to claim 1, further comprising:

means for dissipating heat from the sub-thermoelement to air from the storage compartment of the cabinet.

12. The storage box according to claim 11, further comprised of said means for dissipating heat comprising a heat dissipating unit provided at a heat dissipating junction of the sub-thermoelement, and further comprising a fan being arranged in a body of the sub-storage unit so as to allow the heat dissipating unit to dissipate heat to air from the storage compartment of the cabinet.

13. A storage box, comprising:

a cabinet including a storage compartment;

a main thermoelement installed in a wall of the cabinet so as to allow the storage compartment to selectively act as any of a cool-storage compartment and a hot-storage compartment; and a sub-storage-unit for selective installation in the storage compartment, the sub-storage unit including a sub-thermoelement so as to allow the sub-storage unit to be operated in a frozen-storage mode through a multi-stage cooling operation during a cool-storage mode operation of the storage compartment, when the sub-storage unit is installed in the storage compartment.

14. A cooling method for a storage box, comprising the steps of:

providing a storage compartment in a storage box;

positioning a sub-storage unit in the storage compartment;

operating the sub-storage unit in a frozen-storage mode during a cool-storage mode operation of the storage compartment; and dissipating heat from the sub-storage unit to air from the storage compartment.

15. The method of claim 14, further comprising the steps of:

providing a main thermoelement for the storage compartment to selectively act as any of a cool-storage compartment and a hot-storage compartment;

providing a sub-thermoelement for operation of the sub-storage unit in the frozen-storage mode during the cool-storage mode operation of the storage compartment; and dissipating heat from the sub-thermoelement to air from the storage compartment.

* * * * *